United States Patent
Chen et al.

(10) Patent No.: US 12,237,647 B2
(45) Date of Patent: Feb. 25, 2025

(54) TECHNIQUES FOR VERTICAL CAVITY SURFACE EMITTING LASER OXIDATION

(71) Applicant: Taiwan Semiconductor Manufacturing Company, Ltd., Hsin-Chu (TW)

(72) Inventors: Chen Yu Chen, Hsinchu (TW); Ming Chyi Liu, Hsinchu (TW); Jhih-Bin Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 504 days.

(21) Appl. No.: 17/718,393

(22) Filed: Apr. 12, 2022

(65) Prior Publication Data

US 2022/0239067 A1    Jul. 28, 2022

Related U.S. Application Data

(60) Division of application No. 17/070,508, filed on Oct. 14, 2020, now Pat. No. 11,309,685, which is a
(Continued)

(51) Int. Cl.
*H01S 5/183* (2006.01)
*H01S 5/02* (2006.01)
(Continued)

(52) U.S. Cl.
CPC .......... *H01S 5/18358* (2013.01); *H01S 5/021* (2013.01); *H01S 5/028* (2013.01);
(Continued)

(58) Field of Classification Search
CPC ...... H01S 5/18358; H01S 5/021; H01S 5/028; H01S 5/18308; H01S 5/18311;
(Continued)

(56) References Cited

U.S. PATENT DOCUMENTS

| 5,357,591 A | 10/1994 | Jiang et al. |
| 6,144,682 A | 11/2000 | Sun |

(Continued)

FOREIGN PATENT DOCUMENTS

| JP | H0555713 A | 3/1993 | |
| JP | 2003318493 A | * 11/2003 | ........... H01L 31/032 |

OTHER PUBLICATIONS

Non-Final Office Action dated Apr. 7, 2020 for U.S. Appl. No. 16/122,018.
(Continued)

*Primary Examiner* — Yuanda Zhang
(74) *Attorney, Agent, or Firm* — Eschweiler & Potashnik, LLC

(57) ABSTRACT

Some embodiments relate to a method for forming a vertical cavity surface emitting laser (VCSEL) structure. The method includes forming an optically active layer over a lower reflective layer and forming an upper reflector over the optically active layer. A first spacer is formed along sidewalls of the upper reflector. An oxidation process is performed with the first spacer in place to oxidize a peripheral region of the optically active layer. A first etch process is performed on the lower reflective layer and the oxidized peripheral region, thereby forming a lower reflector and an optically active region.

20 Claims, 10 Drawing Sheets

Related U.S. Application Data continuation of application No. 16/122,018, filed on Sep. 5, 2018, now Pat. No. 10,847,949.

(60) Provisional application No. 62/724,243, filed on Aug. 29, 2018.

(51) Int. Cl.
*H01S 5/028* (2006.01)
*H01S 5/187* (2006.01)
*H01S 5/20* (2006.01)

(52) U.S. Cl.
CPC ...... *H01S 5/18308* (2013.01); *H01S 5/18311* (2013.01); *H01S 5/18322* (2013.01); *H01S 5/187* (2013.01); *H01S 5/2027* (2013.01); *H01S 5/2086* (2013.01)

(58) Field of Classification Search
CPC .... H01S 5/18322; H01S 5/187; H01S 5/2027; H01S 5/2086
See application file for complete search history.

(56) References Cited

U.S. PATENT DOCUMENTS

| | | | |
|---|---|---|---|
| 6,879,612 | B1 | 4/2005 | Wasserbauer |
| 2002/0075922 | A1* | 6/2002 | Yoo ........................ B82Y 20/00 372/45.013 |
| 2002/0109149 | A1 | 8/2002 | Chang |
| 2003/0022406 | A1 | 1/2003 | Liao et al. |
| 2003/0053503 | A1 | 3/2003 | Yang |
| 2003/0063642 | A1 | 4/2003 | Aggerstam et al. |
| 2003/0185268 | A1 | 10/2003 | Zhang |
| 2006/0002444 | A1 | 1/2006 | Wang et al. |
| 2007/0217472 | A1 | 9/2007 | Collins et al. |
| 2015/0357794 | A1 | 12/2015 | Tsuji |
| 2018/0278022 | A1 | 9/2018 | Li et al. |
| 2018/0287345 | A1 | 10/2018 | Laflaquiere et al. |
| 2019/0252857 | A1 | 8/2019 | Qiao et al. |

OTHER PUBLICATIONS

Notice of Allowance dated Jul. 17, 2020 for U.S. Appl. No. 16/122,018.
Non-Final Office Action dated Aug. 13, 2021 for U.S. Appl. No. 17/070,508.
Notice of Allowance dated Dec. 22, 2021 for U.S. Appl. No. 17/070,508.

* cited by examiner

TECHNIQUES FOR VERTICAL CAVITY SURFACE EMITTING LASER OXIDATION

REFERENCE TO RELATED APPLICATIONS

This application is a Divisional of U.S. application Ser. No. 17/070,508, filed on Oct. 14, 2020, which is a Continuation of U.S. application Ser. No. 16/122,018, filed on Sep. 5, 2018 (now U.S. Pat. No. 10,847,949, issued on Nov. 24, 2020), which claims the benefit of U.S. Provisional Application No. 62/724,243, filed on Aug. 29, 2018. The contents of the above-referenced patent applications are hereby incorporated by reference in their entirety.

BACKGROUND

Laser diodes are used in many kinds of devices and are well-known. A semiconductor vertical cavity surface emitting laser (VCSEL) is one promising candidate for next generation laser diodes. Compared to current laser diodes, such as edge-emitting devices, the emission from a VCSEL is normal to the plane of the device, therefore it can be processed using standard processing techniques. Furthermore, the advantageous emission from the VCSEL device allows for production of a large plurality of lasers on a single wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
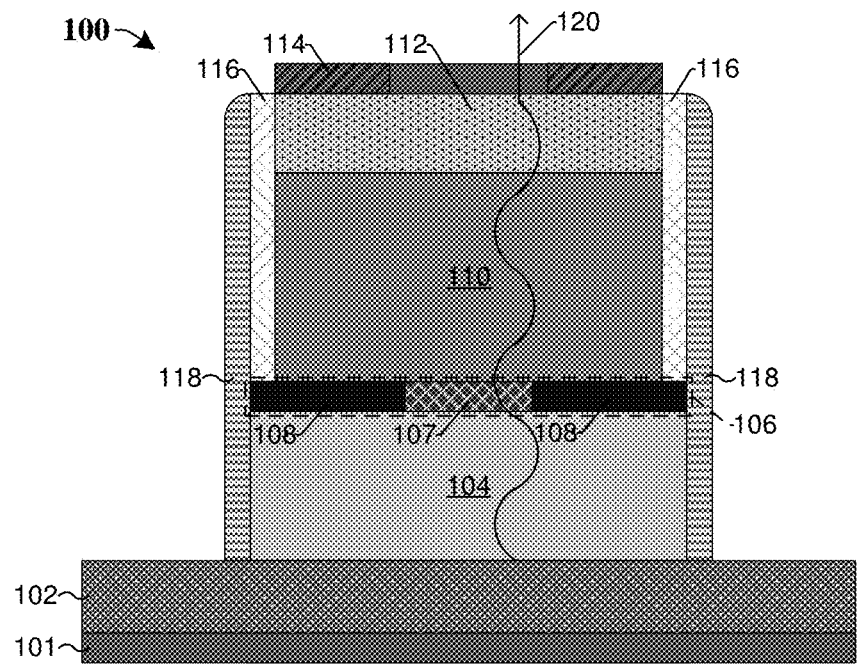
FIGS. 1 through 7 illustrate a cross-sectional view of some embodiments of a VCSEL device, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor vertical cavity surface emitting laser (VCSEL) device includes top and bottom electrodes, with distributed Bragg reflectors (DBRs) and an optically active region arranged between the top and bottom electrodes. The DBRs comprise DBR layers, which are comprised of a stack of alternating layers. In conventional VCSEL device fabrication, an etching process is performed to form outer sidewalls of the DBR layers and the optically active region. Then, an oxidation process is performed, causing oxidation to occur on the outer sidewalls of the DBR layers and the optically active region. After the oxidation process, a sidewall spacer is formed to cover the oxidized outer sidewalls of the DBR layers and the optically active region. Although use of this fabrication method is widely adopted, the oxidation in the DBR layers results in a decrease in thermal conductivity and a decrease in the operable wavelength bandwidth for the device. This results in a higher thermal temperature in the optically active region during normal operation. As the temperature of the optically active region increases, the operating wavelength will increase respectively. This causes an unwanted defect as the device will no longer operate at the desired wavelength.

In some embodiments of the present disclosure, to prevent the oxidation in the DBR layers, sidewall spacers may be introduced at intermediate steps of the above process. First, a substrate is formed over a first electrode and a second set of DBR layers is formed over the substrate. An optically active region is formed over the second set of DBR layers. Then, a first set of DBR layers is formed over the optically active region. The new process involves an etching process performed through the first set of DBR layers. Then, a first sidewall spacer formed around sidewalls of the first set of DBR layers. An oxidation process is then performed after the first sidewall spacer has been formed, where the oxidation will only form in the optically active region. Then, an etching process is performed through the optically active region and the second set of DBR layers below the optically active region. Finally, a second sidewall spacer is formed around outer sidewalls of the first sidewall spacer, second set of DBR layers, and the optically active region. This prevents any oxidation from forming in any of the DBR layers, therefore preventing the defect related to oxidation in the DBR layers.

Referring to FIG. 1, a cross-sectional view of a VCSEL device 100 in accordance with some embodiments is provided. The VCSEL device 100 includes a bottom electrode 101 with a substrate 102 disposed over the bottom electrode 101. The substrate 102 may be, for example, a bulk substrate (e.g., a bulk silicon substrate), a silicon-on-insulator (SOI) substrate, or the like. In some embodiments, the substrate 102 is a layer of gallium arsenide. A first reflector 104 is disposed over the substrate 102. An optically active region 106, which includes a central optically active region 107 comprising a metal (un-oxidized) and a peripheral optically active region 108 comprising an oxidized version of the metal, is disposed over the first reflector 104. The first reflector 104 and the peripheral optically active region 106 have outer sidewalls that are aligned. A second reflector 110 is disposed over the optically active region 106, and a masking layer 112 is disposed over the second reflector 110. A top electrode 114 with a central aperture is disposed over the masking layer 112. A first spacer 116 is disposed over the optically active region 106 and covers outer sidewalls of the second reflector 110 and masking layer 112. A second spacer 118 disposed over the substrate 102 and covers outer sidewalls of the first spacer 116, the optically active region 106, and the first reflector 104.

In some embodiments, the bottom electrode 101 comprises copper, iron, cobalt, nickel, titanium, or the like. In some embodiments, the top electrode 114 comprises copper, iron, cobalt, nickel, titanium, or the like; and can be made of the same material or a different material than the bottom electrode 101. In some embodiments, the masking layer 112 may, for example, be or comprise a photo resist, silicon oxide, or the like formed to a thickness within a range of between approximately 1.5 micrometers to approximately 4 micrometers. In some embodiments, the first spacer 116 comprises a nitride, such as titanium nitride or silicon nitride formed to a thickness within a range of between approximately 1000 and approximately 2000 micrometers. In some embodiments, the second spacer 118 comprises a nitride, such as titanium nitride or silicon nitride formed to a thickness within a range of between approximately 1000 and approximately 2000 micrometers. In some embodiments, the central region 107 of the optically active region 106 comprises a metal, such as aluminum; while the peripheral region 108 comprises an oxidized version of the metal, such as aluminum oxide. In some embodiments, the central region of optically active region 106 comprises a high concentration of aluminum, for example ranging from 96% to 100% aluminum, which can promote higher thermal conductivity for the optically active region than lower concentrations of aluminum.

During operation of the VCSEL device 100, a bias is applied across the bottom electrode 101 and top electrode 114, which causes the central optically active region 107 to emit light 120. The first and second reflectors 104, 110 are positioned so that the generated light 120 reflects multiple times between the first and second reflectors 104, 110, and due to the effects of interference, some patterns and/or frequencies of light are amplified by constructive interference while other patterns and/or frequencies of light are attenuated by destructive interference. In this way, after multiple reflections back and forth between the first reflector 104 and the second reflector 110, the light 120 passes out through the aperture in the top electrode 114 with a predetermined wavelength.

While the VCSEL device is generating this light 120, heat is also generated. To better dissipate this heat, the first spacer 116 has an innermost sidewall that entirely covers an outer sidewall of the second reflector 110. Moreover, the first spacer 116 is formed in direct contact with un-oxidized material on the outer sidewall of the second reflector 110. Compared to previous approaches where outer sidewalls of the second reflector 110 were oxidized, embodiments of the present disclosure where the second reflector 110 remains entirely un-oxidized within the confines of the first spacer 116 provides the second reflector 110 with a higher thermal conductivity. Because of this, the second reflector 110 is made entirely of un-oxidized material, which allows the second reflector 110 to more efficiently dissipate heat. Therefore, compared to previous VCSELs, the VCSEL device 100 of FIG. 1 is able to maintain a more constant temperature during operation and correspondingly outputs light 120 at a more consistent wavelength.

Figure 2:
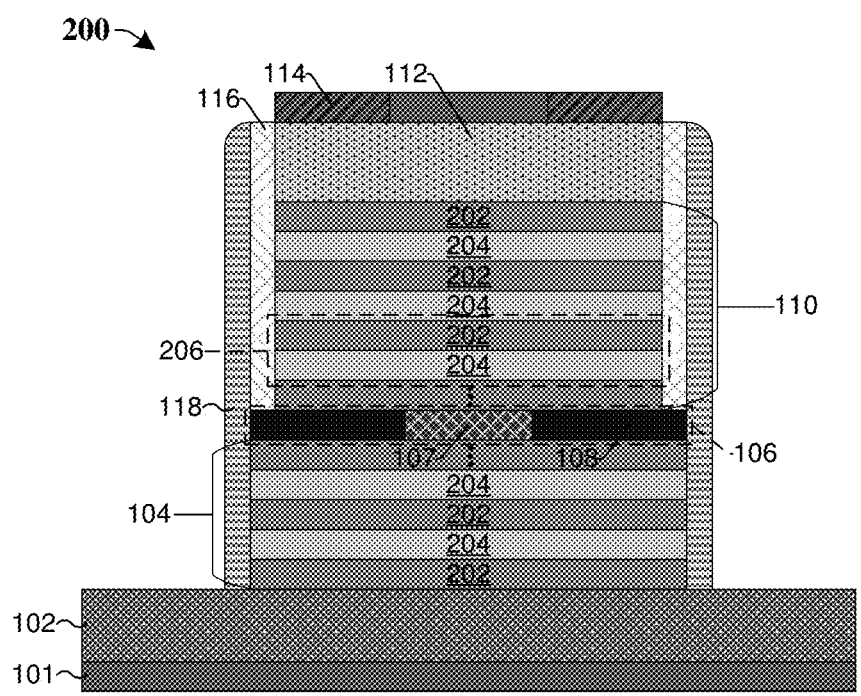

FIG. 2 illustrates a cross-sectional view of some additional embodiments of a VCSEL device 200. The first reflector 104 and second reflector 110 are comprised of alternating layers of two different materials with different refractive indices. The stack of alternating layers comprise of a first layer 202 and a second layer 204. In some embodiments, the first layer 202 may be comprised of Gallium arsenide (GaAs) and the second layer 204 may be comprised of Aluminum arsenide (AlAs). In some embodiments, the first reflector 104 and the second reflector 110 are each comprised of 40 pairs or greater of alternating layers of the first layer 202 and the second layer 204.

In some embodiments, the first reflector 104 and second reflector 110 may be distributed Bragg reflectors (DBRs) containing a stack of pairs 206. The stack of pairs 206 comprise of a first layer 202 and a second layer 204. Each pair 206 may be about one-half wavelength thick, where a wavelength corresponds to the wavelength emitted from the VCSEL device. Each individual layer, first layer 202 and second layer 204, may be about one-fourth wavelength thick. For example, in some embodiments, the wavelength emitted from the VCSEL device is 840 nm, and the pair 206 has a thickness of approximately 420 nm. Each individual layer, first layer 202 and second layer 204, of the pair 206 may be comprised of different materials with different concentrations. In some embodiments, the first layer 202 comprises Aluminum Gallium Arsenide with an Aluminum concentration of 10% ($Al_{0.1}GaAs$), the second layer 204 comprises Aluminum Gallium Arsenide with an Aluminum concentration of 90% ($Al_{0.9}GaAs$). In other embodiments, the first layer 202 comprises Gallium Arsenide (GaAs), the second layer 204 comprises Aluminum Arsenide (AlAs). These other embodiments where the first layer is GaAs and the second layer is AlAs have a lower thermal resistivity than embodiments where the first layer is $Al_{0.1}GaAs$ and the second layer is $Al_{0.9}GaAs$.

Figure 3:
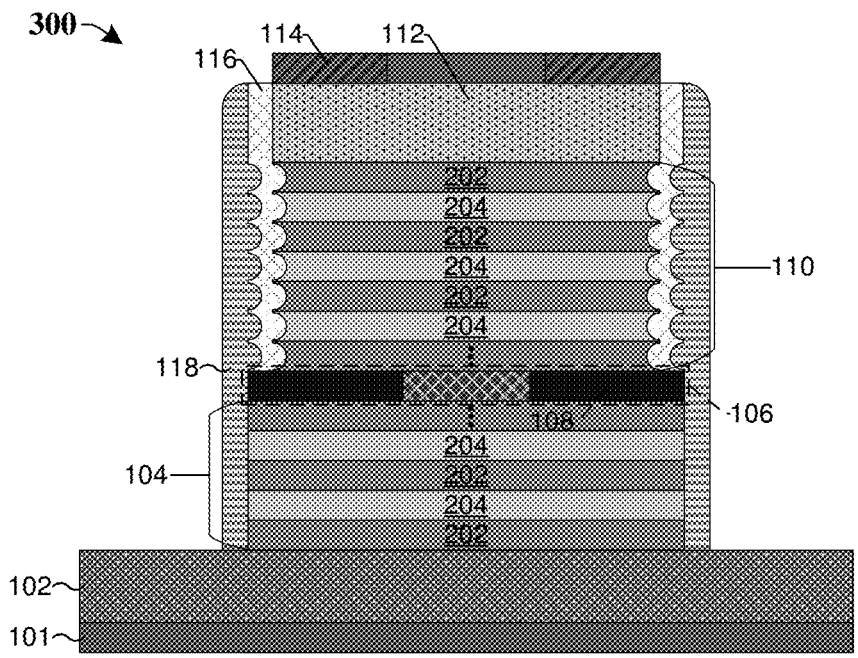

FIG. 3 illustrates a cross-sectional view of some additional embodiments of a VCSEL device 300. Outer sidewalls of the second reflector 110 comprise a plurality of recesses. Inner sidewalls of the first spacer 116 comprise a plurality of protrusions that engagedly meet the plurality of recesses in the second reflector 110. Outer sidewalls of the first spacer 116 comprise a second plurality of recesses. In some embodiments, the plurality of protrusions and the plurality of recesses comprise of semicircles. In some embodiments, the plurality of protrusions and the plurality of recesses comprise of triangles. Outer sidewalls of the first layer 202 and the second layer 204 comprise a recess. In some embodiments, outer sidewalls of the first layer 202 and the second layer 204 comprise a plurality of recesses (not shown).

Figure 4:
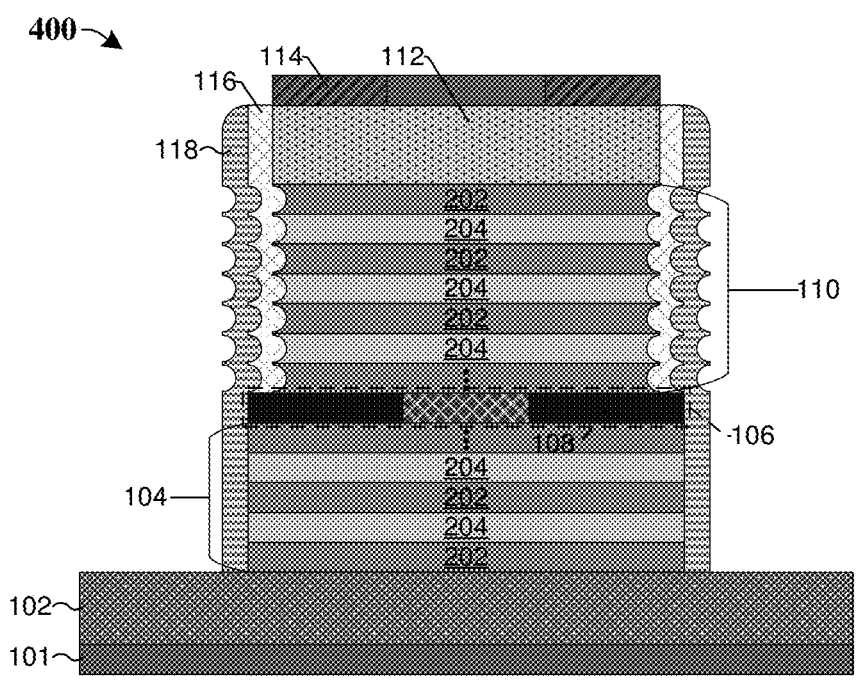

FIG. 4 illustrates a cross-sectional view of some additional embodiments of a VCSEL device 400. Outer sidewalls of the second reflector 110 comprise a plurality of recesses. Inner sidewalls of the first spacer 116 comprise a plurality of protrusions that engagedly meet the plurality of recesses in the second reflector 110. Outer sidewalls of the first spacer 116 comprise a second plurality of recesses. Inner sidewalls of the second spacer 118 comprise a second plurality of protrusions that directly contact the second plurality of recesses of the first spacer 116. Outer sidewalls of the second spacer 118 comprise a third plurality of recesses. In some embodiments, the plurality of protrusions and the plurality of recesses comprise semicircles. Outer sidewalls of the first layer 202 and the second layer 204 comprise a recess.

Figure 5:
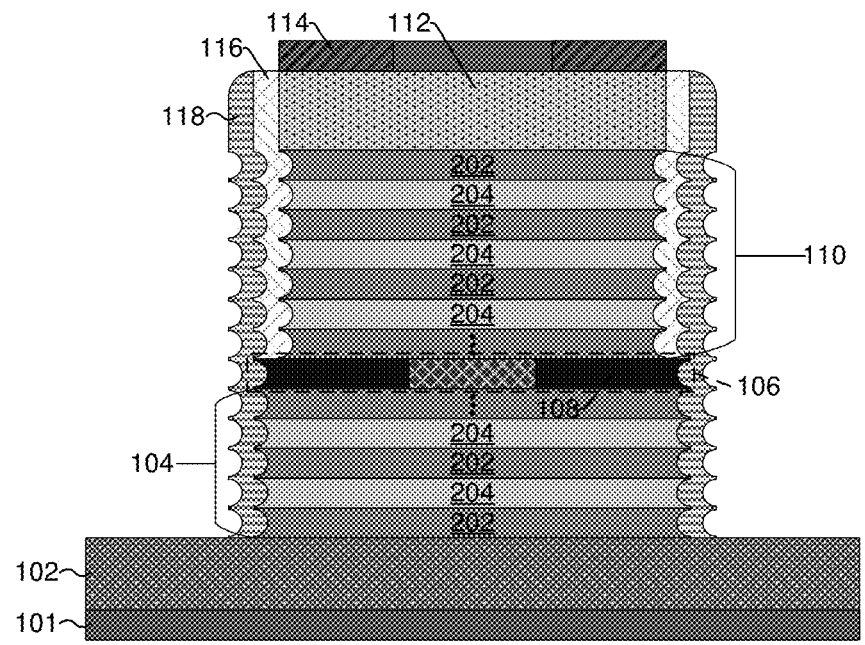

FIG. 5 illustrates a cross-sectional view of some additional embodiments of a VCSEL device 500. Outer sidewalls of the second reflector 110 comprise a plurality of recesses. Inner sidewalls of the first spacer 116 comprise a plurality of protrusions that meet the plurality of recesses in the second reflector 110. Outer sidewalls of the first spacer 116 comprise a second plurality of recesses. Outer sidewalls of the optically active region 106 comprise a fourth plurality of recesses. Outer sidewalls of the first reflector 104 comprise a fifth plurality of recesses. Inner sidewalls of the second spacer 118 comprise a second plurality of protrusions that directly contact the second plurality of recesses of the first spacer 116, the fourth plurality of recesses of the optically active region 106, and the fifth plurality of recesses of the first reflector 104. Outer sidewalls of the second spacer 118 comprise a third plurality of recesses. In some embodiments, the plurality of protrusions and the plurality of recesses comprise of semicircles. Outer sidewalls of the first layer 202 and the second layer 204 comprise a recess. In some embodiments, outer sidewalls of the first layer 202 and the second layer 204 comprise a plurality of recesses (not shown).

Figure 6:
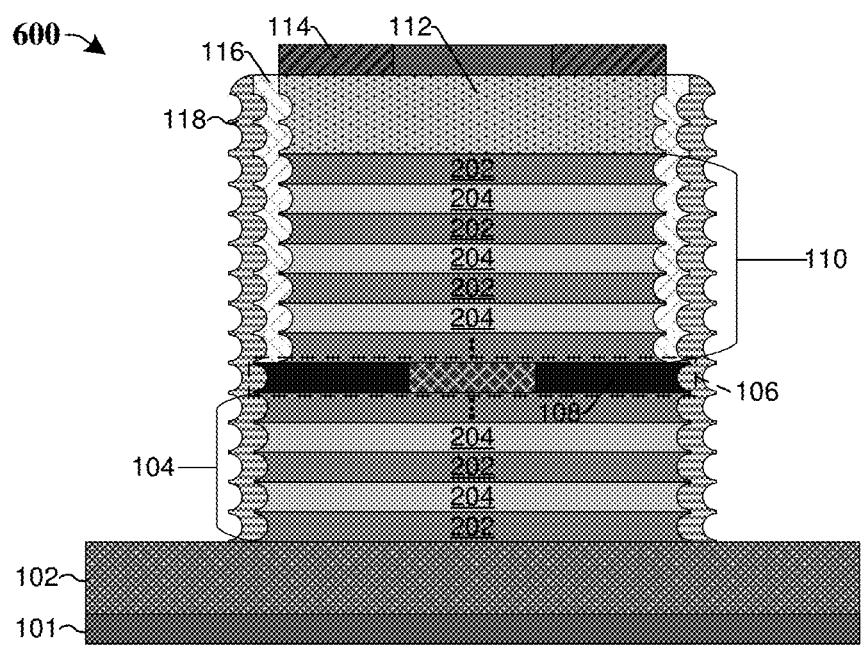

FIG. 6 illustrates a cross-sectional view of some additional embodiments of a VCSEL device 600. Outer sidewalls of the second reflector 110 comprise a plurality of recesses. Outer sidewalls of the masking layer 112 comprise a sixth plurality of recesses. Inner sidewalls of the first spacer 116 comprise a plurality of protrusions that meet the plurality of recesses in the second reflector 110, and the sixth plurality of recesses in the first spacer 116. Outer sidewalls of the first spacer 116 comprise a second plurality of recesses. Outer sidewalls of the optically active region 106 comprise a fourth plurality of recesses. Outer sidewalls of the first reflector 104 comprise a fifth plurality of recesses. Inner sidewalls of the second spacer 118 comprise a second plurality of protrusions that directly contact the second plurality of recesses of the first spacer 116, the fourth plurality of recesses of the optically active region 106, and the fifth plurality of recesses of the first reflector 104. Outer sidewalls of the second spacer 118 comprise a third plurality of recesses. In some embodiments, the plurality of protrusions and the plurality of recesses comprise of semicircles. Outer sidewalls of the first layer 202 and the second layer 204 comprise a recess. In some embodiments, outer sidewalls of the first layer 202 and the second layer 204 comprise a plurality of recesses (not shown).

Figure 7:
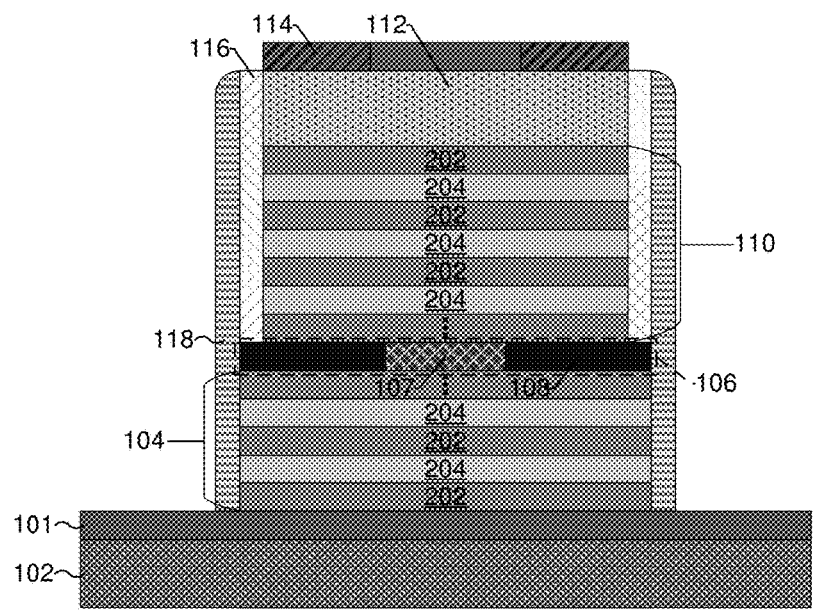

FIG. 7 illustrates a cross-sectional view of some additional embodiments of a VCSEL device 700. Compared to the VCSEL device of FIG. 1, the VCSEL device 700 has flipped the positions of the bottom electrode 101 and substrate 102. It will be appreciated that positions of the bottom electrode 101 and substrate 102 can also be flipped in the other embodiments illustrated and/or discussed herein, and these variations are contemplated as falling within the scope of the present disclosure.

Figure 8A:
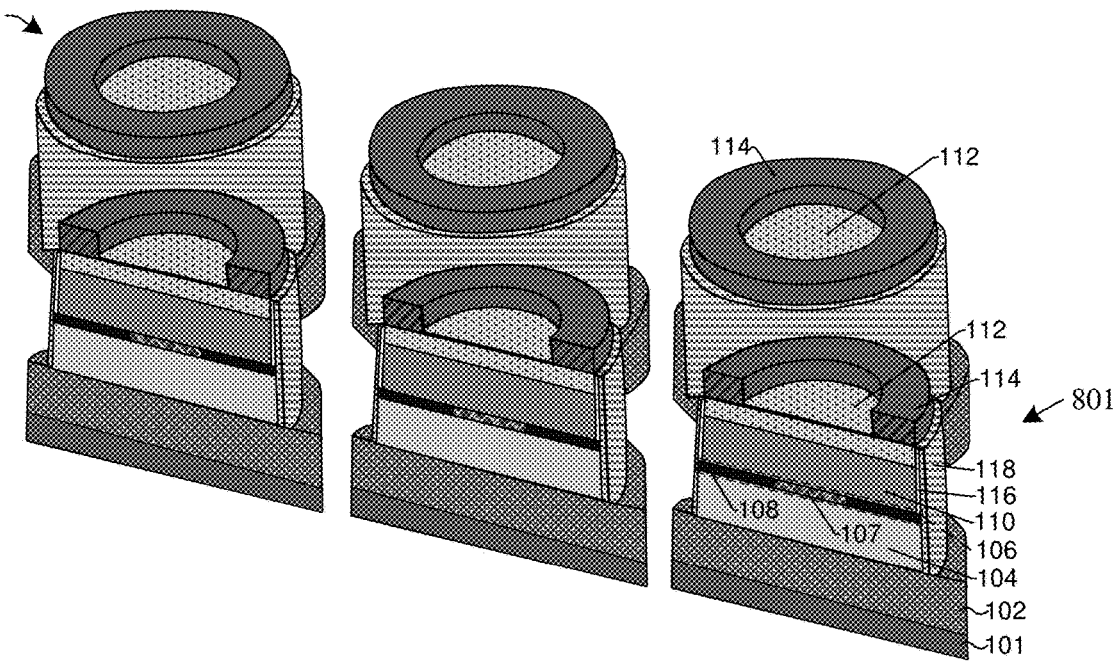
FIG. 8A illustrates a perspective view of some embodiments of a laser device including an array of VCSEL devices with a cross-sectional cut shown for some of the VCSEL devices, according to the present disclosure.

FIG. 8A illustrates a perspective view of some embodiments of a laser device 800a including an array of VCSEL devices with a cross-sectional cut shown for some of the VCSEL devices. In some embodiments, a VCSEL device 801 may be comprised within an array having a plurality of VCSEL devices arranged in rows and columns. The VCSEL device 801 includes a bottom electrode 101 with a substrate 102 disposed over the bottom electrode 101. A first reflector 104 is disposed over the substrate 102. An optically active region 106 is disposed over the first reflector 104. The first reflector 104 and the optically active region 106 have outer sidewalls that are aligned. An oxidized peripheral region 108 of the optically active region 106 is comprised of oxidation. A central region 107 of the optically active region 106 does not contain oxidation. A second reflector 110 disposed over the optically active region 106. A masking layer 112 disposed over the second reflector 110. An electrode 114 is formed over the masking layer 112. In some embodiments the electrode 114 comprises an aperture through a center of the electrode 114 exposing an upper surface of the masking layer 112. A first spacer 116 disposed over the optically active region 106 and covering outer sidewalls of the second reflector 110 and masking layer 112. A second spacer 118 disposed over the bottom electrode 101 and covering outer sidewalls of the first spacer 116, the optically active region 106, and the first reflector 104.

Figure 8B:
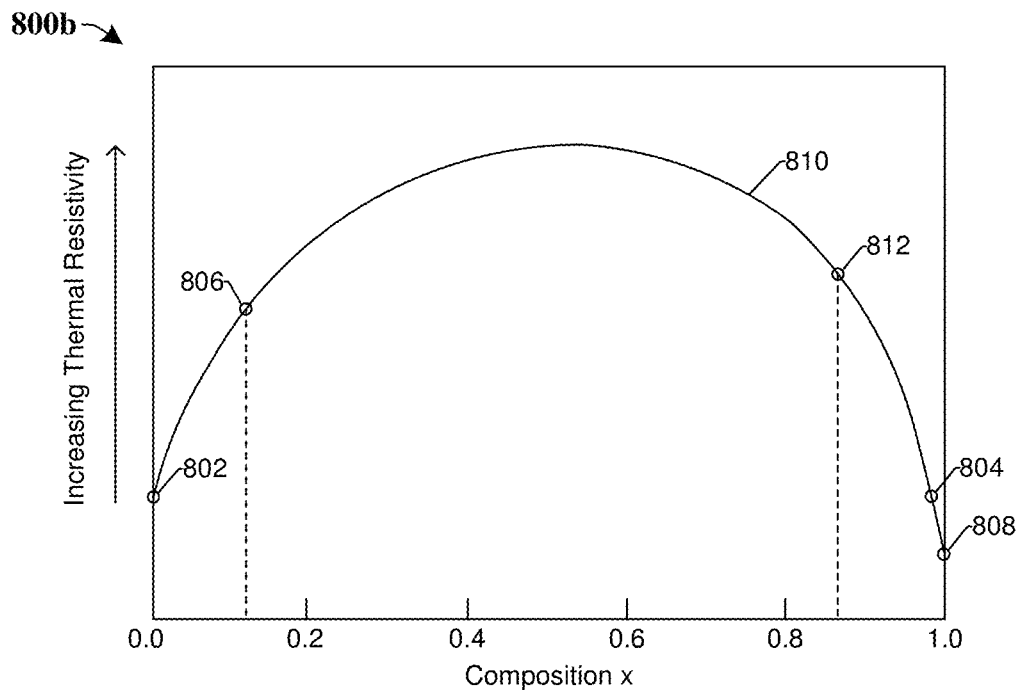
FIG. 8B illustrates a graph which sets forth thermal conductivity properties for a number of different materials used in different embodiments of a VCSEL device, according to the present disclosure.

FIG. 8B illustrates a graph 800b comprising a thermal resistivity curve 810 demonstrating thermal conductivity properties of embodiments of a VCSEL device, such as previously illustrated and described in FIGS. 1-7. The thermal resistivity curve 810 reflects thermal resistivity of a compound comprising aluminum gallium arsenide, with a chemical formula $Al_xGa_{x-1}As$. The x-axis of FIG. 8B represents the value of x in the above chemical formula. The y-axis of FIG. 8B represents increasing thermal resistivity (cm*K/W, e.g. centimeter*kelvin/watt) of the compound comprising $Al_xGa_{x-1}As$. A VCSEL device comprising materials with low thermal conductivity will prevent heat from building up in an optically active region of the VCSEL device during operation, which will prevent the device from failing due to a shift in operating frequency from the buildup of heat in the optically active region.

More particularly in FIG. 8B a first point 802 corresponds to an x value of 0 and a second point 808 corresponds to an x value of 1. In some embodiments of a VCSEL device according to the present disclosure, for example, the first point 802 corresponds to a thermal resistivity of the first layer 202 (e.g. the first layer 202 comprises GaAs), the second point 808 corresponds to a thermal resistivity of the second layer 204 (e.g. the second layer 204 comprises AlAs). Therefore, in the above example, a combination of the first and second layers 202, 204 will result in an overall low thermal resistivity for the VCSEL device. In some embodiments, a third point 804 represents a concentration of Al in the optically active region 106. In some embodiments the concentration of Al in the optically active region 106 is less than the concentration of Al in the second layer 204. For example, the concentration of Al in the optically active region 106 is 98% (e.g. $Al_{0.98}$) while the concentration of Al in the second layer 204 is 100% (e.g. AlAs).

Additionally in FIG. 8B a range of x values between points 806 and 812 represent the range of x values in which DBR stacks within a second VCSEL device comprise oxidization. The range of x values between points 806 and 812 can be within the range of approximately 0.1 and 0.9, e.g. where a first layer in the DBR stacks comprises $Al_{0.1}Ga_{0.9}As$ (e.g. x=0.1) and a second layer in the DBR stacks comprises $Al_{0.9}Ga_{0.1}As$ (e.g. x=0.9). The thermal resistivity curve 810 between the points 806 and 812 depict a range of thermal resistivity of the compounds used to make the first and second layer in the DBR stacks of the second VCSEL device.

A thermal resistivity of a combination of the first and second layers of the second VCSEL device will be greater than the thermal resistivity of the combination of the first and second layers 202, 204 of the VCSEL device according to the present disclosure. Therefore, the second VCSEL device that comprises oxidation in the DBR stacks suffers from endurance degradation due to a higher thermal resistivity in the DBR stacks. Thus, the VCSEL device according to the present disclosure has improved endurance due to a lower thermal resistivity, allowing the device to better dissipate heat within the optically active region during operation.

Figure 8C:
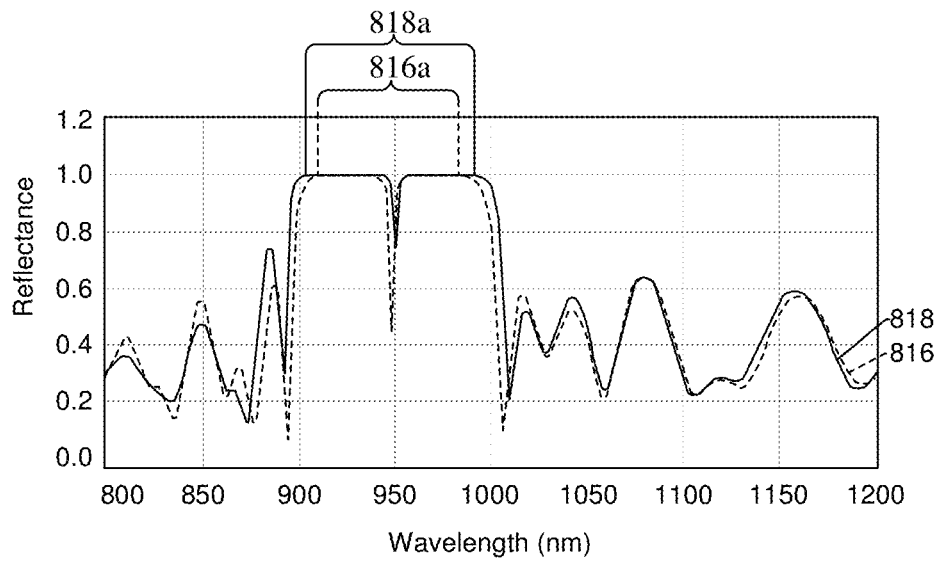
FIG. 8C illustrates a graph which sets forth reflectance properties for a number of different VCSEL devices and highlights some performance examples of a VCSEL device, according to the present disclosure.

FIG. 8C illustrates a graph 800c comprising a pair of reflectance curves of embodiments of a VCSEL device, such as previously illustrated and described in FIGS. 1-7. It can be appreciated that a VCSEL device could be designed for many different wavelengths, therefore FIG. 8C and the associated wavelength values are merely an example. During operation of the VCSEL device, a voltage is applied across the device and the VCSEL device has an operating wavelength, monochromatic light will emit when the operating wavelength is at a resonance wavelength. The VCSEL device commonly has a range of resonance wavelengths called an operating bandwidth. During operation of the VSCEL device, heat will build up in an optically active region of the device and cause the operating wavelength to increase. As the heat increases, the operating wavelength can increase outside of the operating bandwidth and cause the VCSEL device to fail to emit monochromatic light. In regards to FIG. 8C the operating bandwidth can be defined as any wavelength with a reflectance of 1.0, or any wavelength above a specific reflectance value such as a reflectance above approximately 0.75, 0.85, or 0.95.

More particularly in FIG. 8C a first reflectance curve 818 corresponds to a spectral reflectance of a VCSEL device according to the present disclosure. A first operating bandwidth 818a corresponds to an operating bandwidth of the first reflectance curve 818. In some embodiments the first operating bandwidth 818a is between approximately 905 nm and approximately 985 nm. A second reflectance curve 816 corresponds to a spectral reflectance of a second VCSEL device that comprises oxidation in its DBR stacks. A second operating bandwidth 816a corresponds to an operating bandwidth of the second reflectance curve 816. In some embodiments the second operating bandwidth 816a is between approximately 920 nm and approximately 965 nm. In comparison of the first and second reflectance curves 818, 816, the first operating bandwidth 818a comprises a greater range of resonance wavelength values compared to the second operating bandwidth 816a. Additional, a trough near a center of the first operating bandwidth 818a has a substantially greater reflectance value than a trough near a center of the second operating bandwidth 816a. Therefore, during operation of the second VCSEL device, as heat builds up within an optically active region of the second VCSEL device an operating wavelength will increase outside of the second operating bandwidth 816a more quickly than the VCSEL device according to the present disclosure. Thus, sidewall spacers in the VCSEL device according to the present disclosure increase the operating bandwidth of the VCSEL device and increases the device's ability to emit monochromatic light.

FIGS. 9-16 illustrate cross-sectional views 900-1600 of some embodiments of a method of forming a VCSEL device. Although the cross-sectional views 900-1600 shown in FIGS. 9-16 are described with reference to a method, it will be appreciated that the structures shown in FIGS. 9-16 are not limited to the method but rather may stand alone separate of the method. Although FIGS. 9-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 9:
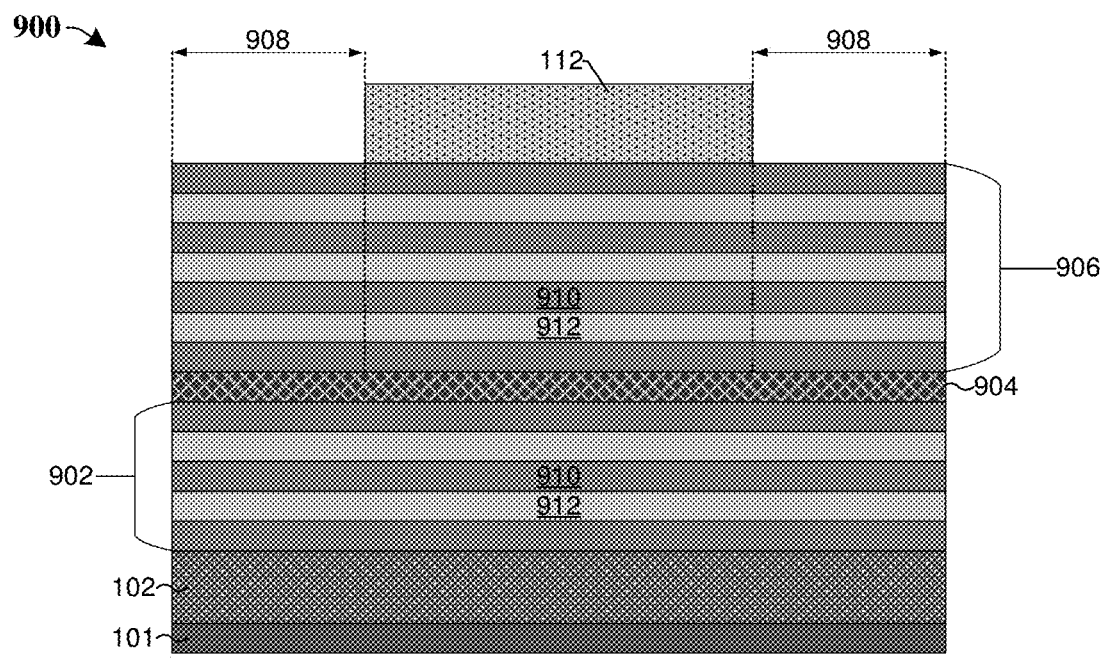
FIGS. 9 through 16 illustrate a cross-sectional view of some embodiments of a method of forming a VCSEL device, according to the present disclosure.

As shown in cross-sectional view 900 of FIG. 9, a bottom electrode 101 is formed on a lower surface of substrate 102. In some embodiments, the bottom electrode 101 comprises Copper, Iron, Cobalt, Nickel, Titanium, or the like. The substrate 102 may be, for example, a bulk substrate (e.g., a bulk silicon substrate) or a silicon-on-insulator (SOI) substrate. A first reflective layer 902 is formed over the substrate 102. The first reflective layer 902 is comprised of alternating layers of two different materials with different refractive indices. The stack of alternating layers for the first reflective layer 902 may comprise a third layer 910, which may be comprised of Gallium arsenide (GaAs), and a fourth layer 912, which may be comprised of Aluminum arsenide (AlAs). In some embodiments, the first reflective layer 902 is comprised of 40 pairs or greater of alternating layers of the third layer 910 and the fourth layer 912. An optically active layer 904 is formed over the first reflective layer 902. In some embodiments the optically active layer 904 comprises a metal, such as aluminum; and may comprise gallium and/or arsenide. In some embodiments, the optically active layer 904 comprises a high concentration of aluminum (e.g. at least 98%, up to 100%), the remaining concentration of the optically active layer 904 may be, for example, gallium in a concentration of approximately 0.5% to approximately 1.5% and/or arsenide in a concentration of approximately 0.5% to approximately 1.5% randomly distributed across the optically active layer 904. A second reflective layer 906 is formed over the optically active layer 904. The second reflective layer 906 comprises alternating layers of two different materials with different refractive indices. The stack of alternating layers for the second reflective layer 906 can comprise third layer 910, which may be comprised of Gallium arsenide (GaAs), and the fourth layer 912, which may be comprised of Aluminum arsenide (AlAs). A masking layer 112 is formed over the second reflective layer 906. The masking layer 112 is patterned, for example by using photolithography, to cover a first portion of the second reflective layer 906 and leave a sacrificial portion 908 of the second reflective layer 906 exposed.

Figure 10:
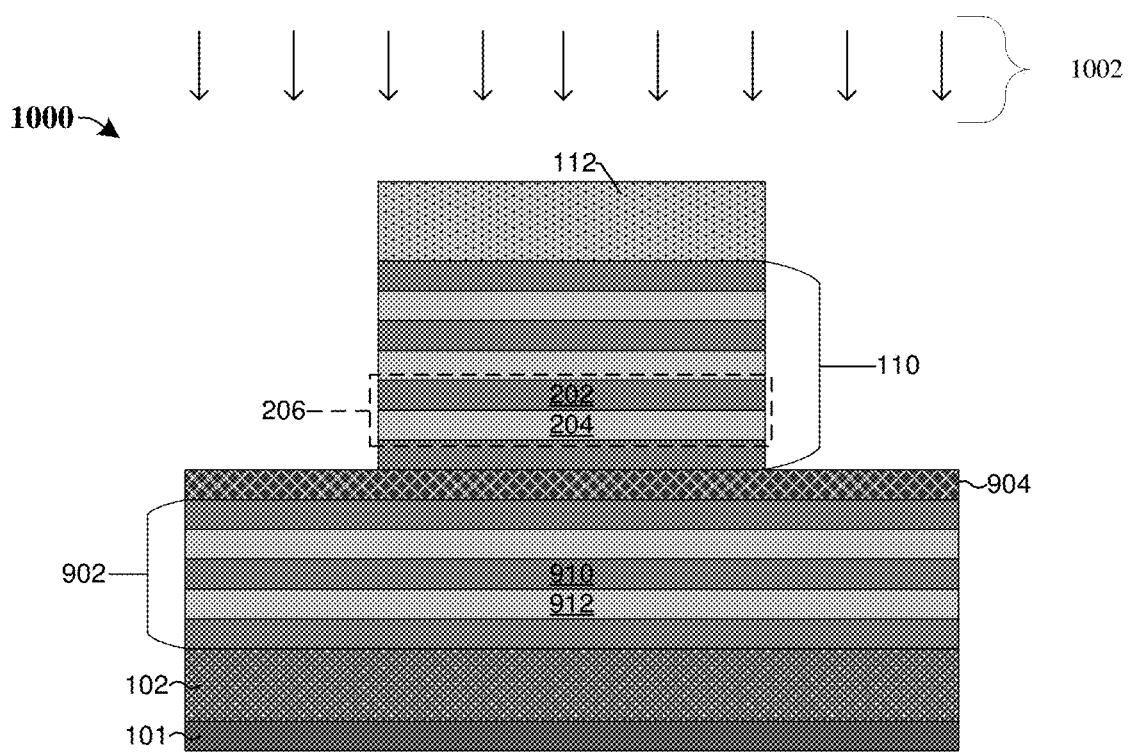

As shown in cross-sectional view 1000 of FIG. 10, an etching process 1002 is performed to etch the second reflective layer 906 and remove the sacrificial portion 908 to define a second reflector 110. The etching process 1002 involves performing a first etch process to remove the sacrificial portion of the third layer 910, thereby defining the first layer 202, and using a second different etch process to remove the sacrificial portion of the fourth layer 912, defining the second layer 204. The alternation between the first etch process and the second etch process is repeated until an upper surface of the optically active layer 904 is exposed. In some embodiments, the first etch process involves a vertical etch or an anisotropic etch with a first etchant. In some embodiments, the second etch process involves an isotropic etch or a wet etch. In some embodiments, the first etchant is a different chemical than the second etchant.

In some embodiments, first etch initially leaves the third layer 910 with substantially vertical sidewalls, then the second etch bevels and/or recesses these sidewalls of the third layer 910 and also bevels and/or recesses sidewalls of the fourth layer 912. In some embodiments, the second etch process etches more lateral material on the fourth layer 912 than the first etch process etches lateral material on the third layer 910. This results in the outermost sidewalls of the first layer 202 having a greater maximum width than the outermost sidewalls of the second layer 204 (not shown). In some embodiments, the above process is used iteratively to propagate through each of the pairs in the second reflector 110. This causes a first pair of the pair 206 to have a greater maximum width than a maximum width of a second pair of the pair 206 (not shown). The first pair is located above the second pair.

Figure 11:
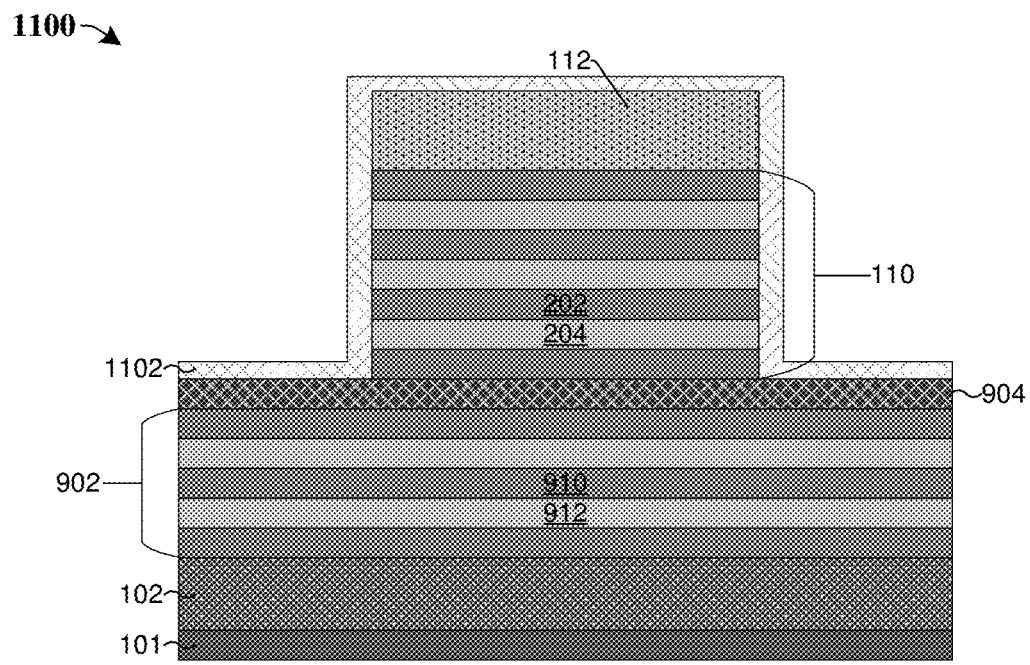

As shown in cross-sectional view 1100 of FIG. 11, a first spacer layer 1102 is formed over the optically active layer 904 and the masking layer 112. The first spacer layer 1102 covers outer sidewalls of the second reflector 110 and outer sidewalls of the masking layer 112. In some embodiments, the first spacer layer 1102 comprises a nitride, such as titanium nitride or silicon nitride formed to a thickness within a range of between approximately 750 and approximately 1000 micrometers.

Figure 12:
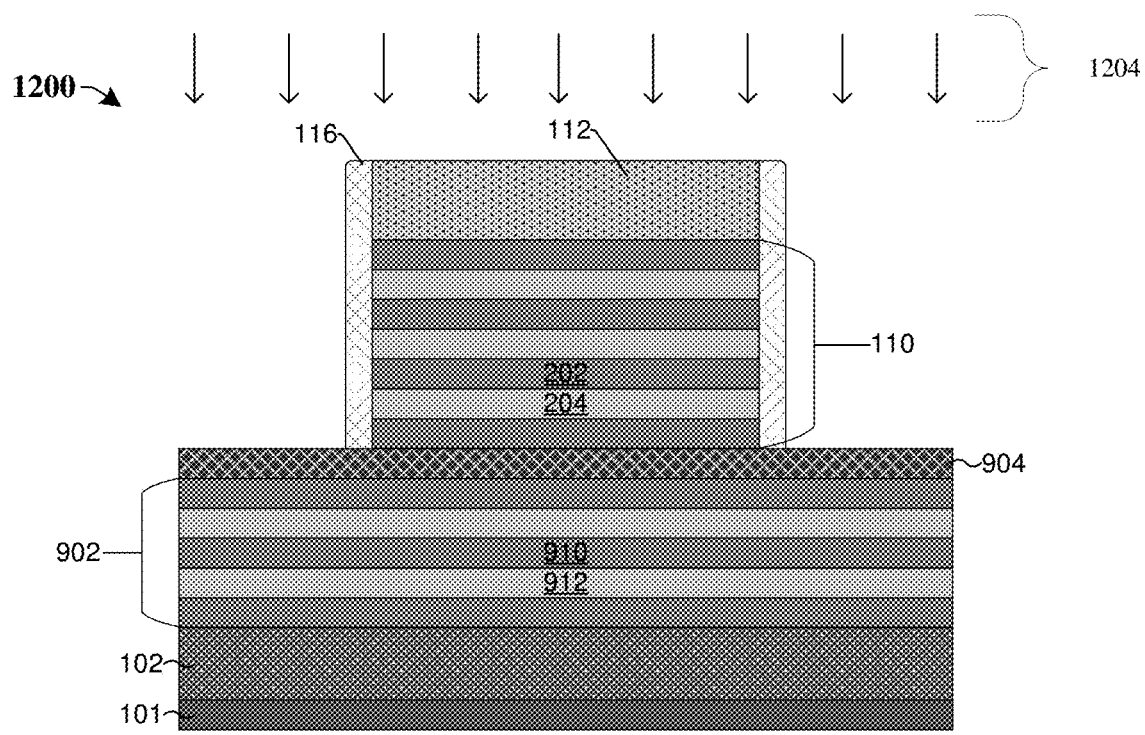

As shown in cross-sectional view 1200 of FIG. 12, a portion of the first spacer layer 1102 is removed by exposing the first spacer layer 1102 to an etchant 1204 (e.g., a vertical or anisotropic etch, such as a plasma etch) to define a first spacer 116. The first spacer 116 covers outer sidewalls of the masking layer 112 and outer sidewalls of the second reflector 110. A lower surface of the first spacer 116 contacts the upper surface of the optically active layer 904.

Figure 13:
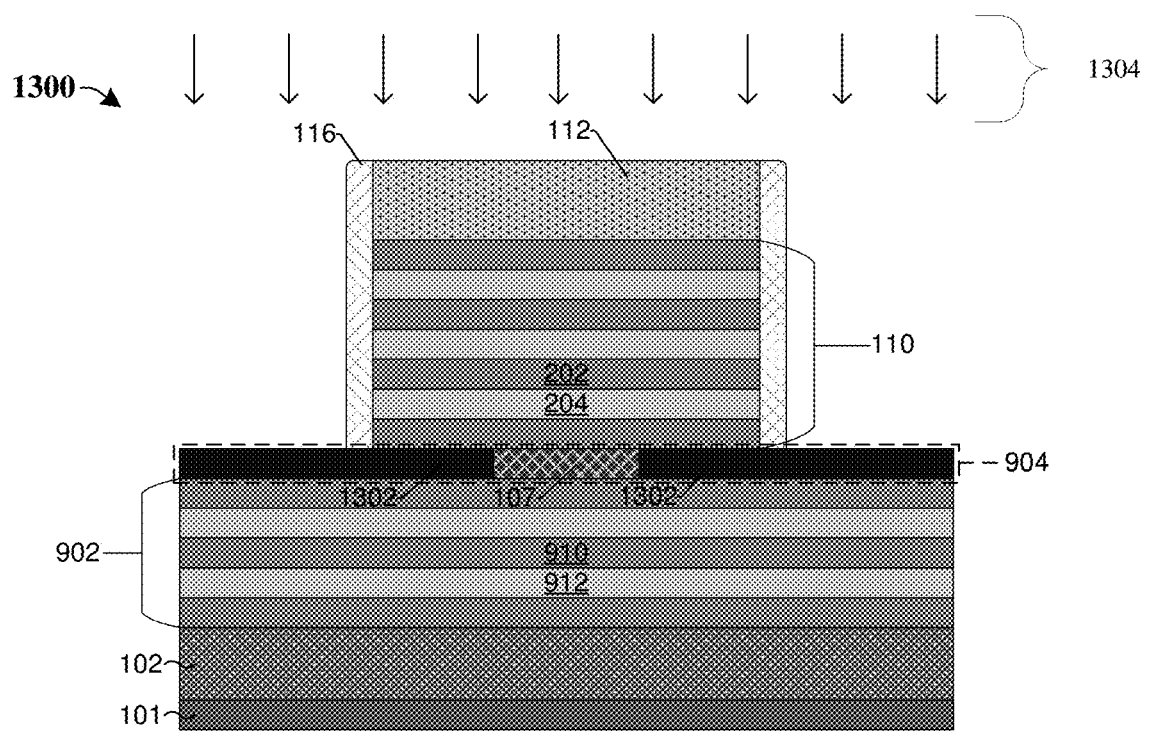

As shown in cross-sectional view 1300 of FIG. 13, a thermal oxidation process 1304 is performed on the optically active layer 904. This thermal oxidation process leaves a central region 107 of the optically active layer 904 un-oxidized, and defines an oxidized peripheral region 1302 of the optically active layer 904. The oxidized peripheral region 1302 extends under the first spacer 116, and under the second reflector 110. Thus, innermost sidewalls of the oxidized peripheral region 1302 of the optically active layer 904 extend below and within outermost sidewalls of the second reflector 110. Innermost sidewalls of the oxidized peripheral region 1302 of the optically active layer 904 are in direct contact with outermost sidewalls of the central region 107 of the optically active layer 904. In some embodiments, the central region 107 is un-oxidized.

Figure 14:
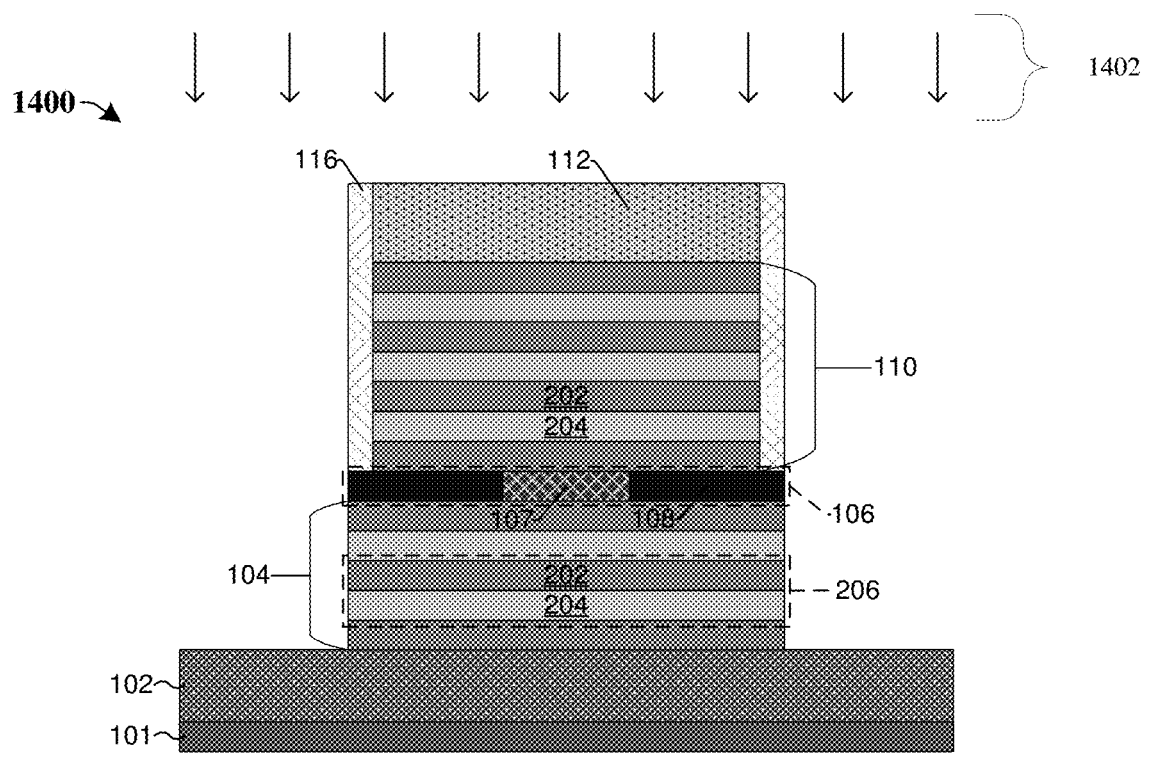

As shown in cross-sectional view 1400 of FIG. 14, an etching process 1402 is performed to etch the optically active layer 904 to define an optically active region 106 and to etch the first reflective layer 902 to define a first reflector 104. The etching process 1402 involves performing a third etch process to remove a portion of the optically active layer 904, defining the optically active region 106. Then, alternating between a first etch process to remove a portion of the third layer 910, thereby defining the first layer 202, and a second etch process to remove a portion of the fourth layer 912, thereby defining the second layer 204. The alternation between the first etch process and the second etch process is repeated until an upper surface of the substrate 102 is exposed. In some embodiments, the first etch process involves a vertical etch or an anisotropic etch with a first etchant. In some embodiments, the second etch process involves an isotropic etch or a wet etch with a second etchant. In some embodiments, the second etchant is a different chemical than the first etchant.

In some embodiments, first etch initially leaves the third layer 910 with substantially vertical sidewalls, then the second etch bevels and/or recesses these sidewalls of the third layer 910 and also bevels and/or recesses sidewalls of the fourth layer 912. In some embodiments, the second etch process etches more lateral material on the fourth layer 912 than the first etch process etches lateral material on the third layer 910. This results in the outermost sidewalls of the first layer 202 to have a greater maximum width than the outermost sidewalls of the second layer 204 (not shown). In some embodiments, the above process propagates through all of the pairs in the first reflector 104. This causes a first pair of the pair 206 to have a greater maximum width than a maximum width of a second pair of the pair 206 (not shown). The first pair is located above the second pair.

Figure 15:
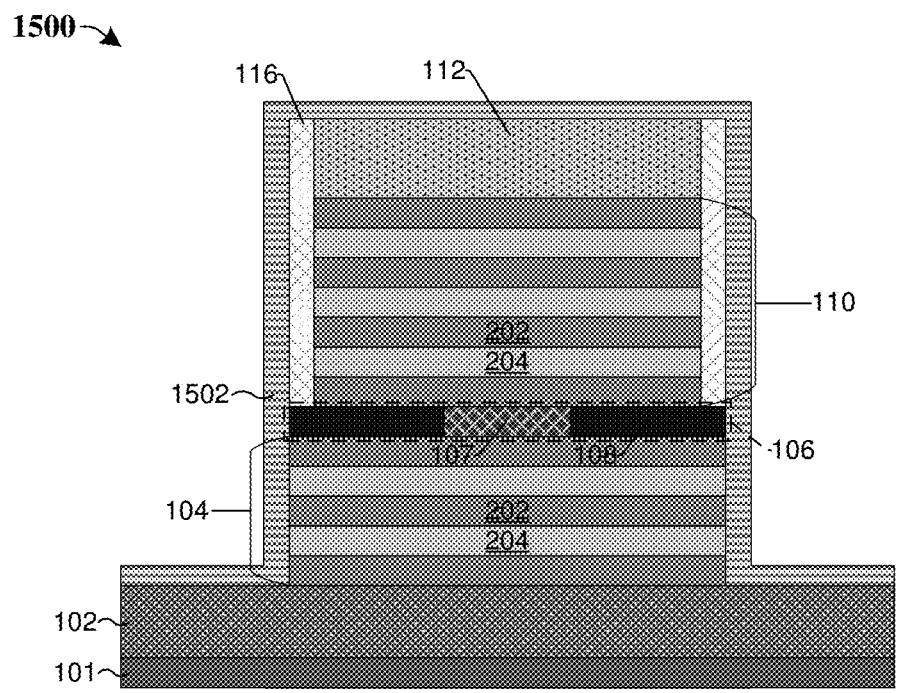

As shown in cross-sectional view 1500 of FIG. 15, a second spacer layer 1502 is formed over the masking layer 112, first spacer 116, and the substrate 102. The second spacer layer 1502 covers outermost sidewalls of the first spacer 116, outermost sidewalls of the optically active region 106, and outermost sidewalls of the first reflector 104. In some embodiments, the second spacer layer 1502 comprises a nitride, such as titanium nitride or silicon nitride, and is formed to a thickness within a range of between approximately 750 and approximately 1000 micrometers.

Figure 16:
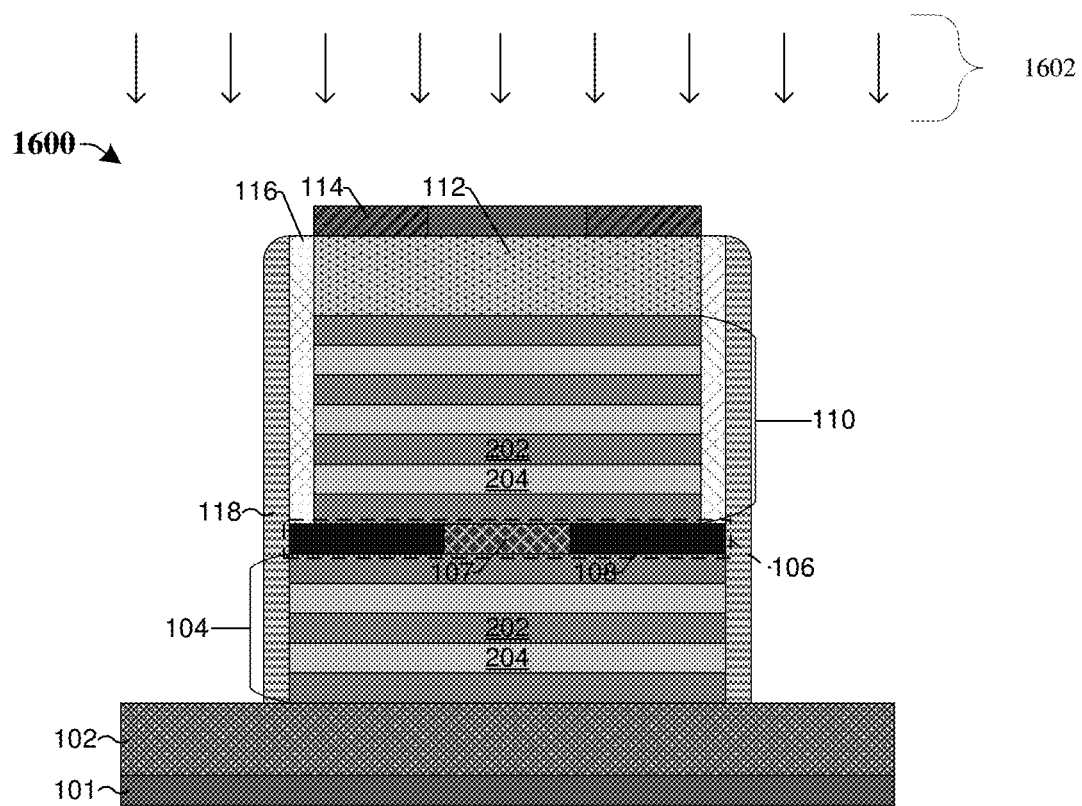

As shown in cross-sectional view 1600 of FIG. 16, a portion of the second spacer layer 1502 is removed by exposing the second spacer layer 1502 to an etchant 1602 to define a second spacer 118. The second spacer 118 covers outermost sidewalls of the first spacer 116, outermost sidewalls of the optically active region 106, and outermost sidewalls of the first reflector 104. A lower surface of the second spacer 118 contacts the upper surface of the substrate 102. An electrode 114 is formed over the masking layer 112. In some embodiments the electrode 114 comprises an aperture through a center of the electrode 114 exposing an upper surface of the masking layer 112. In some embodiments, the electrode 114 comprises Copper, Iron, Cobalt, Nickel, Titanium, or the like.

Figure 17:
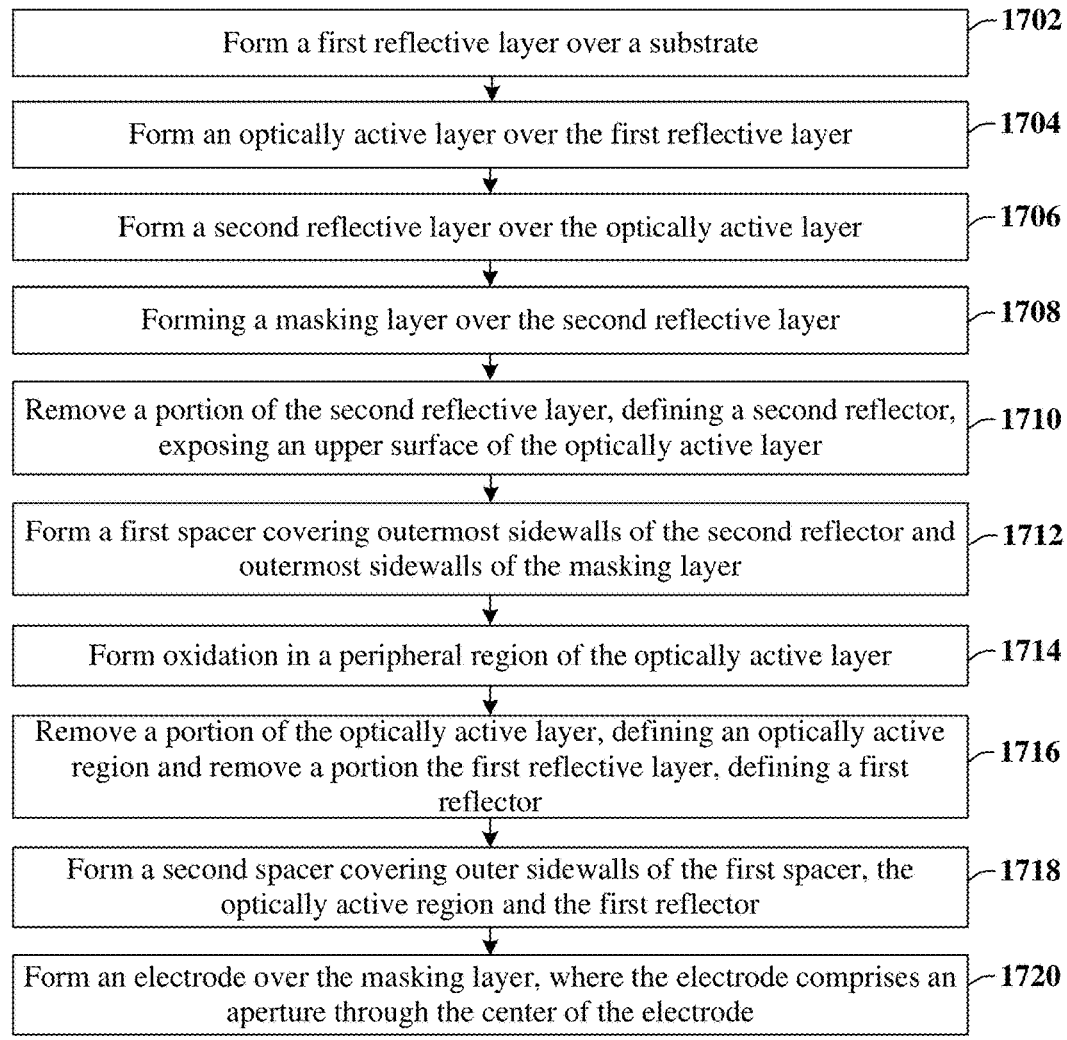
FIG. 17 illustrates a methodology in flowchart format that illustrates some embodiments of a method of forming a VCSEL device.

FIG. 17 illustrates a method 1700 of forming a VCSEL device in accordance with some embodiments. Although the method 1700 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1702, a first reflective layer is formed over a substrate. FIG. 9 illustrates a cross-sectional view 900 corresponding to some embodiments of act 1702.

At 1704, an optically active layer is formed over the first reflective layer. FIG. 9 illustrates a cross-sectional view 900 corresponding to some embodiments of act 1704.

At 1706, a second reflective layer is formed over the optically active layer. FIG. 9 illustrates a cross-sectional view 900 corresponding to some embodiments of act 1706.

At 1708, a masking layer is formed over the second reflective layer. FIG. 9 illustrates a cross-sectional view 900 corresponding to some embodiments of act 1708.

At 1710, a portion of the second reflective layer is removed, defining a second reflector and exposing an upper surface of the optically active layer. FIG. 10 illustrates a cross-sectional view 1000 corresponding to some embodiments of act 1710.

At 1712, a first spacer is formed covering outermost sidewalls of the second reflector and outermost sidewalls of the masking layer. FIGS. 11 and 12 illustrate a cross-sectional view 1100 and 1200 corresponding to some embodiments of act 1712.

At 1714, oxidation is formed in a peripheral region of the optically active layer. FIG. 13 illustrates a cross-sectional view 1300 corresponding to some embodiments of act 1714.

At 1716, a portion of the optically active layer is removed, defining an optically active region and remove a portion of the first reflective layer, defining a first reflector. FIG. 14 illustrates a cross-sectional view 1400 corresponding to some embodiments of act 1716.

At 1718, a second spacer is formed covering outer sidewalls of the first spacer, outer sidewalls of the optically active region and outer sidewalls of the first reflector. FIGS. 15 and 16 illustrate a cross-sectional view 1500 and 1600 corresponding to some embodiments of act 1718.

At 1720, an electrode is formed over the masking layer, where the electrode comprises an aperture through the center of the electrode. FIG. 16 illustrates a cross-sectional view 1600 corresponding to some embodiments of act 1720.

Accordingly, in some embodiments, the present disclosure relates to a method of forming a VCSEL device that performs an oxidation process to produce oxidation in the optically active region and no oxidation forms in the first and second reflector.

In some embodiments, the present disclosure relates to a method for manufacturing a vertical cavity surface emitting laser. The method includes forming an optically active layer disposed over a first reflective layer; forming a second reflective layer disposed over the optically active layer; forming a masking layer disposed over the second reflective layer, the masking layer covers a reflector region of the second reflective layer, the masking layer leaves a sacrificial portion of the second reflective layer exposed; performing a first etch process to remove the sacrificial portion of the second reflective layer, defining a second reflector and exposing an upper surface of the optically active layer; forming a first spacer covering outer sidewalls of the second reflector and outer sidewalls of the masking layer, a lower surface of the first spacer contacts the upper surface of the optically active layer; performing an oxidation process with the first spacer in place to oxidize a peripheral region of the optically active layer while leaving a central region of the optically active layer un-oxidized; performing a second etch process to remove a portion of the oxidized peripheral region, defining an optically active region and removing a portion of the first reflective layer, defining a first reflector; forming a second spacer covering outer sidewalls of the first spacer, outer sidewalls of a remaining portion of the oxidized peripheral region, and outer sidewalls of the first reflector.

In some embodiments, the present disclosure relates to a vertical surface emitting laser (VCSEL) structure. A substrate disposed over a first electrode; a first reflector disposed over the substrate; an optically active region disposed over the first reflector, the first reflector and the optically active region have outer sidewalls that are aligned; a second reflector disposed over the optically active region, the optically active region is optically coupled to the first and second reflectors; a masking layer disposed over the second reflector; a second electrode disposed over the masking layer, the second electrode contains an aperture through a center of the second electrode exposing an upper surface of the masking layer; a first spacer covering outer sidewalls of the second reflector, a lower surface of the first spacer contacts an upper surface of the optically active region; a second spacer covering outer sidewalls of the first spacer, outer sidewalls of the optically active region, and outer sidewalls of the second reflector.

In some embodiments, the present disclosure relates to a vertical surface emitting laser (VCSEL) structure. A first reflector disposed over a substrate, the first reflector comprises a first aluminum arsenide layer, and a first gallium arsenide layer stacked over the first aluminum arsenide layer; an optically active region over the first reflector, the optically active region comprising a central region and a peripheral region surrounding the central region, the central region comprising aluminum, and the peripheral region comprising aluminum oxide, the peripheral region has outer sidewalls that are aligned with outer sidewalls of the first reflector; a second reflector disposed over the optically active region, the second reflector comprises a second aluminum arsenide layer, and a second gallium arsenide layer stacked over the second aluminum arsenide layer, the optically active region is optically coupled to the first and second reflectors; a masking layer disposed over the second reflector; a second electrode disposed over the masking layer, the second electrode contains an aperture through a center of the second electrode exposing an upper surface of the masking layer; a first spacer covering outer sidewalls of the second reflector, a lower surface of the first spacer contacts an upper surface of the peripheral region of the optically active region, inner sidewalls of the first spacer directly contact outer sidewalls of the second reflector without any oxidation material separating the first spacer from the second reflector; a second spacer covering outer sidewalls of the first spacer, the outer sidewalls of the peripheral region of the optically active region, and the outer sidewalls of the second reflector.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a vertical cavity surface emitting laser (VCSEL) structure comprising:
   forming an optically active layer over a lower reflective layer;
   forming an upper reflector over the optically active layer;
   forming a first spacer along sidewalls of the upper reflector;
   performing an oxidation process with the first spacer in place to oxidize a peripheral region of the optically active layer; and
   performing a first etch process on the lower reflective layer and the oxidized peripheral region, thereby forming a lower reflector and an optically active region.

2. The method of claim 1, wherein inner sidewalls of the first spacer comprise a first plurality of protrusions that contact a first plurality of recesses in the upper reflector.

3. The method of claim 2, further comprising:
   forming a second spacer covering outer sidewalls of the first spacer, outer sidewalls of the optically active region, and outer sidewalls of the lower reflector.

4. The method of claim 3, wherein inner sidewalls of the second spacer comprise a second plurality of protrusions that contact a second plurality of recesses in the outer sidewalls of the first spacer.

5. The method of claim 4, wherein the first and second plurality of protrusions are curved.

6. The method of claim 4, wherein the inner sidewalls of the second spacer comprise a third plurality of protrusions that contact a third plurality of recesses in the lower reflector and the optically active region.

7. The method of claim 3, wherein outer sidewalls of the second spacer comprise a third plurality of recesses.

8. The method of claim 1, wherein forming the first spacer comprises:
   forming a first spacer layer over the upper reflector, along sidewalls of the upper reflector, and along an upper surface of the optically active layer; and
   performing a second etch process on the first spacer layer to remove the first spacer layer from over the upper reflector and the upper surface of the optically active layer, thereby defining the first spacer.

9. A method for forming a semiconductor structure comprising:
   forming an optically active layer over a lower reflective structure;
   forming an upper reflective structure over the optically active layer;
   performing a first removal process on the upper reflective structure to remove an outer region of the upper reflective structure thereby defining an upper reflector and exposing an upper surface of the optically active layer, wherein the first removal process comprises a first etch process and a second etch process, wherein the first etch process is different than the second etch process; and
   forming a first spacer along sidewalls of the upper reflector and on the upper surface of the optically active layer.

10. The method of claim 9, further comprising:
    performing a second removal process on the optically active layer and the lower reflective structure to remove outer regions of the lower reflective structure and the optically active layer thereby defining a lower reflector and an optically active region, wherein the second removal process comprises a third etch process and a fourth etch process, wherein the third etch process is different than the fourth etch process.

11. The method of claim 10, wherein the second removal process is performed with the first spacer in place.

12. The method of claim 10, further comprising:
    forming a second spacer along sidewalls of the lower reflector and sidewalls of the first spacer.

13. The method of claim 10, wherein the first and third etch processes utilize a first etchant, wherein the second and fourth etch processes utilize a second etchant different than the first etchant.

14. The method of claim 9, further comprising:
    performing an oxidation process on the optically active layer to oxidize a peripheral region of the optically active layer, wherein the oxidation process is performed after forming the first spacer.

15. The method of claim 9, wherein the first etch process comprises an anisotropic etch and the second etch process comprises an isotropic etch.

16. A method for forming a vertical cavity surface emitting laser (VCSEL) structure comprising:
    forming an optically active layer over a lower reflective layer;
    forming an upper reflective layer over the optically active layer;
    forming a masking layer over the upper reflective layer, wherein the masking layer covers a reflector region of the upper reflective layer, wherein the masking layer leaves a sacrificial portion of the upper reflective layer exposed;
    performing a first etch process to remove the sacrificial portion of the upper reflective layer, defining an upper reflector and exposing an upper surface of the optically active layer;
    forming a first spacer covering outer sidewalls of the upper reflector and outer sidewalls of the masking layer, wherein a lower surface of the first spacer contacts the upper surface of the optically active layer;
    performing an oxidation process with the first spacer in place to oxidize a peripheral region of the optically active layer while leaving a central region of the optically active layer un-oxidized;
    performing a second etch process to remove a portion of the oxidized peripheral region, defining an optically active region and removing a portion of the lower reflective layer, defining a lower reflector; and
    forming a second spacer covering outer sidewalls of the first spacer, outer sidewalls of a remaining portion of the oxidized peripheral region, and outer sidewalls of the lower reflector.

17. The method of claim 16, wherein after the second etch process the outer sidewalls of the lower reflector and the outer sidewalls of the optically active region are aligned, wherein a maximum width of the lower reflector and optically active region is greater than a maximum width of the upper reflector.

18. The method of claim 16, wherein the upper and lower reflective layers are comprised of a stack of alternating layers of two different materials with different refractive indices.

19. The method of claim 18, wherein the stack of alternating layers comprises a first layer and a second layer, wherein the first etch process includes performing a third etch process to remove a sacrificial portion of the first layer and a fourth etch process to remove a sacrificial portion of the second layer, and wherein the third etch process is different from the fourth etch process.

20. The method of claim 19, wherein the third etch process includes performing an anisotropic etch and the fourth etch process includes performing an isotropic etch.

* * * * *